US008443034B2

(12) United States Patent
Koushanfar et al.

(10) Patent No.: US 8,443,034 B2
(45) Date of Patent: May 14, 2013

(54) INPUT VECTOR SELECTION FOR REDUCING CURRENT LEAKAGE IN INTEGRATED CIRCUITS

(75) Inventors: Farinaz Koushanfar, Houston, TX (US); Miodrag Potkonjak, Los Angeles, CA (US)

(73) Assignee: Empire Technology Development, LLC, Wilmington, DE (US)

( * ) Notice: Subject to any disclaimer, the term of this patent is extended or adjusted under 35 U.S.C. 154(b) by 1013 days.

(21) Appl. No.: 12/479,584

(22) Filed: Jun. 5, 2009

(65) Prior Publication Data

US 2010/0308895 A1 Dec. 9, 2010

(51) Int. Cl.
*G01F 31/31835* (2011.01)
*H03H 11/40* (2006.01)

(52) U.S. Cl.
USPC ............... 708/800; 708/446; 708/323

(58) Field of Classification Search ............ 708/800; 713/300
See application file for complete search history.

(56) References Cited

U.S. PATENT DOCUMENTS

| 7,479,801 | B2 * | 1/2009 | Bhattacharya | 326/33 |
|---|---|---|---|---|
| 7,941,675 | B2 * | 5/2011 | Burr et al. | 713/300 |
| 8,027,587 | B1 * | 9/2011 | Watts | 398/79 |
| 2004/0128567 | A1 * | 7/2004 | Stewart | 713/300 |
| 2010/0287604 | A1 * | 11/2010 | Potkonjak et al. | 726/6 |

OTHER PUBLICATIONS

Abdollahi, A. et al., "Leakage current reduction in CMOS VLSI circuits by input vector control," IEEE Transactions on Very Large Scale Integration Systems, Feb. 2004, vol. 12, No. 2, pp. 140-154.
Alkabani, Y. et al., "Active hardware metering for intellectual property protection and security," 16th USENIX Security Symposium, 2007, pp. 291-306.
Borkar, S. et al., "Parameter variations and impact on circuits and microarchitecture," 40th Design Automation Conference, 2003, pp. 338-342.
Chandrakasan, A. et al., "Optimizing power using transformations," IEEE Transactions on Computer-Aided Design of Integrated Circuits and Systems, Jan. 1995, vol. 14, No. 1, pp. 12-31.
Hong, I. et al., "Power Optimization of Variable-Voltage Core-Based Systems," IEEE Transactions on Computer-Aided Design of Integrated Circuits and Systems, Dec. 1999, vol. 18, No. 12, pp. 1702-1714.

(Continued)

*Primary Examiner* — Tammara Peyton
(74) *Attorney, Agent, or Firm* — Steven S. Rubin, Esq.; Moritt Hock & Hamroff LLP

(57) ABSTRACT

Techniques are generally described for selecting input vectors that reduce or minimize leakage current for a plurality of integrated circuits (ICs) with the same design, but that differ due to manufacturing variability. In various embodiments, the techniques include determining at least one starting input vector that reduces leakage current in a respective one of N instances of the ICs, and selecting from the determined at least one starting input vector of each respective one of the N instances, a set R of representative input vectors. Some of the embodiments then use each of the representative input vectors in the set R to determine at least a particular input vector to apply to input terminals of an IC in the plurality of ICs to reduce or minimize leakage current in the IC. Additional variants and embodiments may also be disclosed.

29 Claims, 8 Drawing Sheets

OTHER PUBLICATIONS

Chang, H. et al., "Full-chip analysis of leakage power under process variations, including spatial correlations," 42nd Design Automation Conference, 2005, pp. 523-528.

Cheng, L. et al., "A fast simultaneous input vector generation and gate replacement algorithm for leakage power reduction," 43rd Design Automation Conference, 2006, pp. 117-120.

Friedberg, P. et al., "Modeling within-die spatial correlation effects for process-design co-optimization," 6th International Symposium on Quality Electronic Designs, 2005, pp. 516-521.

Koushanfar, F. et al., "CAD-based security, cryptography, and digital rights management," 44th Design Automation Conference, Jun. 2007, pp. 268-269.

Mukhopadhyay, S. et al., "Accurate estimation of total leakage in nanometer-scale bulk CMOS circuits based on device geometry and doping profile," IEEE Transactions on Computer-Aided Design of Integrated Circuits and Systems, Mar. 2005, vol. 24, No. 3, pp. 363-381.

Yuan, L. et al., "A combined gate replacement and input vector control approach for leakage current reduction," IEEE Transactions on Very Large Scale Integration Systems, Feb. 2006, vol. 14, No. 2, pp. 173-182.

Alkabani, Y. et al., "Input vector control for post-silicon leakage current minimization in the presence of manufacturing variability," 45th Design Automation Conference, Jun. 8-13, 2008, pp. 606-609.

Wei, S. et al., "Malicious Circuitry Detection Using Thermal Conditioning" IEEE Transactions on Information Forensics and Security, Sep. 2011, pp. 1136-1145, vol. 6, No. 3.

Wei, S. et al., "Gate-level characterization: foundations and hardware security applications," 47th ACM/IEEE Design Automation Conference, Jun. 2010, pp. 222-227.

Vahdatpour, A. et al., "Leakage Minimization Using Self Sensing and Thermal Management," International Symposium on Low Power Electronics and Design (ISLPED), Aug. 2010, pp. 265-270.

Vahdatpour, A. et al., "A Gate-Level Sensor Network for Integrated Circuits Temperature Monitoring," IEEE Sensors 2010 Conference, Nov. 2010, pp. 625-655.

Wei, S. et al., "Scalable Segmentation-Based Malicious Circuitry Detection and Diagnosis," International Conference on Computer Aided Design, Nov. 2010, pp. 483-486.

Potkonjak, M. et al., "Differential Public, Physically Unclonable Functions: Architecture and Applications," 48th Design Automation Conference, Jun. 2011, 6 pages.

Potkonjak, M. et al., "Hardware Trojan horse detection using gate-level characterization," 46th Design Automation Conference, Jul. 2009, pp. 688-693.

Dabiri, F. et al., "Hardware aging-based software metering," Design, Automation & Test in Europe, Apr. 2009, pp. 460-465.

Jain, A. K. et al., "Data Clustering: A Review," ACM Computing Surveys, Sep. 1999, pp. 264-323, vol. 31, No. 3.

Tiwari, V. et al., "Power Analysis of Embedded Software: A First Step Towards Software Power Minimization," IEEE Transactions on Very Large Scale Integration (VLSI) Systems, Dec. 1994, pp. 437-445, vol. 2, No. 4.

Sharma, M. et al., "Finding a Small Set of Longest Testable Paths that Cover Every Gate," ITC International Test Conference, 2002, pp. 974-982.

\* cited by examiner

| INPUT | 0 | 1 |
|---|---|---|
| LEAKAGE | 100 nA | 227 nA |
| 10x LEAKAGE | 1000 nA | 2270 nA |

INPUT VECTOR SELECTION FOR REDUCING CURRENT LEAKAGE IN INTEGRATED CIRCUITS

STATEMENT REGARDING GOVERNMENT SPONSORED RESEARCH OR DEVELOPMENT

The work described herein was supported at least in part by National Science Foundation (NSF) grant no. 0716674, and at least in part by Defense Advanced Research Projects Agency/Microsystems Technology Office (DARPA/MTO) Young Faculty Award (YFA) grant no. W911NF-07-1-0198. The United States government may have certain rights to the subject matter disclosed herein.

BACKGROUND

Technology scaling has generally improved the speed in manufacturing ICs that embody a particular circuit design, and has further improved the efficient use of the "real estate" area of ICs. Technology scaling has also generally caused power behavior to become a substantive design objective for many classes of ICs and for systems/devices that include the ICs. Initially, power switching was the dominant power consideration in the design process. However, technology scaling has had an impact on the static (leakage) power consumption of circuits. Due to unabated silicon feature scaling, elevated leakage current has thus become an increasingly dominant power consideration in the recent and future designs of ICs. Indeed, there are predictions that leakage current will surpass power switching as the dominant design consideration in upcoming generations of scaled circuit designs.

To reduce the dynamic power (as opposed to static power) consumption, supply voltages have been scaled down as needed during operation of the circuit. To sustain performance, threshold voltages ($V_t$) have also been scaled down, but such scaling-down also may produce significant sub-threshold leakage current. Other variable factors, such as reverse junction bias, also may contribute to the leakage current.

Leakage current may be significant for devices that have low duty cycle modes (e.g., sleep modes), such as sensor network nodes and cellular telephones as examples. Leakage current may also be significant in "ultra-large" chips (e.g., systems-on-chip and network-on-chip architectures), where at any particular moment, a rather large percentage of gates may be in sleep mode because of temporarily lower workloads.

Device-level, circuit-level, and system-level techniques have been proposed to reduce leakage current in an IC, by controlling the input information or an input signal (sometimes referred to as an "input vector") that is provided to the IC. Input vector control (IVC) may be an effective technique to minimize the leakage current because in a circuit's sleep state, the leakage current generally depends on the combination of values (e.g., binary values) of the input vector. However, such conventional IVC techniques may not efficiently determine the value(s) of the input vector that will result in the reduction or minimization of leakage current for a large number of ICs.

BRIEF DESCRIPTION OF THE DRAWINGS

Subject matter is particularly pointed out and distinctly claimed in the concluding portion of the specification. The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. Various embodiments will be described referencing the accompanying drawings in which like references denote similar elements, and in which:

DETAILED DESCRIPTION OF ILLUSTRATIVE EMBODIMENTS

Figure 1:
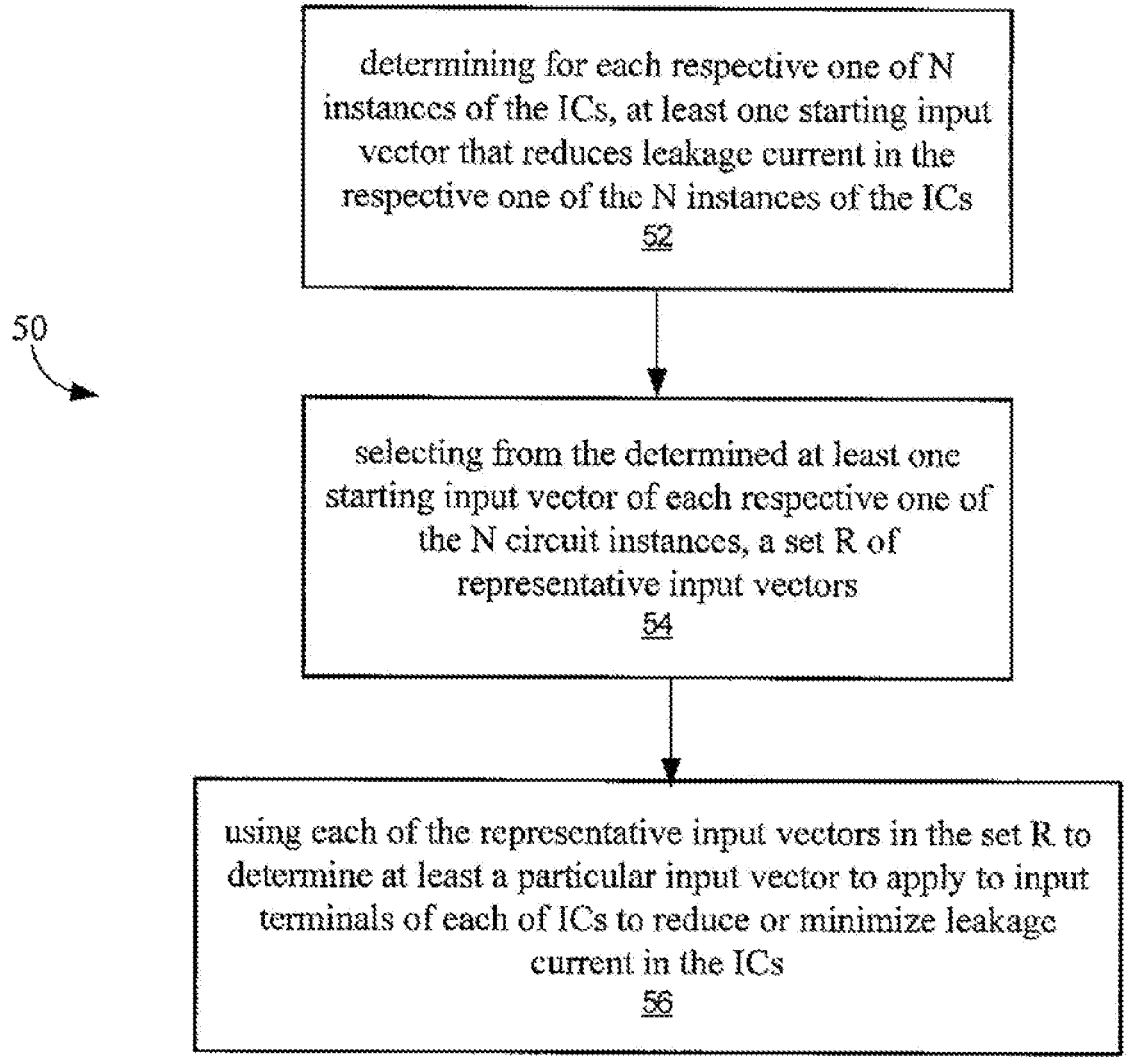
FIG. 1 is a flowchart of a method for selecting input vectors to reduce or minimize leakage current for a plurality of ICs in view of manufacturing variability.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figs., may be arranged, substituted, combined, and designed in a wide variety of different configurations, all of which are explicitly contemplated and make part of this disclosure.

In the following description, algorithms and/or symbolic representations of operations on data bits and/or binary digital signals stored within a computing system, such as within a computer and/or computing system memory may be presented. An algorithm is generally considered to be a self-consistent sequence of operations and/or similar processing leading to a desired result where the operations may involve physical manipulations of physical quantities that may take the form of electrical, magnetic and/or electromagnetic signals capable of being stored, transferred, combined, compared and/or otherwise manipulated. In various contexts such signals may be referred to as bits, data, values, elements, symbols, characters, terms, numbers, numerals, etc. Those skilled in the art will recognize, however, that such terms may be used to connote physical quantities. Hence, when terms such as "storing", "processing", "retrieving", "calculating", "determining" etc. are used in this description they may refer to the actions of a computing platform, such as a computer or a similar electronic computing device such as a cellular telephone, that manipulates and/or transforms data represented as physical quantities including electronic and/or magnetic quantities within the computing platform's processors, memories, registers, etc.

This disclosure is drawn, inter alias to methods, apparatus, systems and computer program products related to reducing or minimizing leakage current of ICs.

Overview of Example Methods

FIG. 1 is a flowchart of a method 50 for selecting input vector to reduce or minimize leakage current for a plurality of ICs in view of manufacturing variability, in accordance with various embodiments of the present disclosure. As will be appreciated from the description to follow, method 50 may be suitable for determining the input vectors of a large number of ICs with the same design but where the ICs differ from one another due to manufacturing variability. As illustrated, method 50 may include, at block 52, determining for each respective one of N instances of the ICs, at least one starting input vector that reduces leakage current in the respective one of the N instances of the ICs. Method 50 may also include, at block 54, selecting from the determined at least one starting input vector of each respective one of the N circuit instances, a set R of representative input vectors. Further, method 50 may include, at block 56, using each of the representative input vectors in the set R to determine at least a particular input vector to apply to input terminals of each of ICs to reduce or minimize leakage current in the ICs.

Various embodiments of method 50 will be further described below with reference to FIGS. 2-7. In particular, various embodiments employing gate-level characterization of the ICs will be described. Briefly, as an overview, for these embodiments, gate-level characterizations may first be performed for one or more ICs that implement the same circuit design but that differ from each other due to manufacturing variability. The gate-level characterizations may represent the effects of manufacturing variability on the leakage current in each IC. Next, N instances of the ICs that each model the gate-level characterizations may be selected (or generated for embodiments employing software equivalent instances of the IC) such that each of the N instances of the ICs also represent the effects of manufacturing variability on their respective leakage current. Then, the input vectors that minimize or reduce leakage current in the ICs to a predetermined or desired level may be determined. In various embodiments, a large neighborhood iterative improvement (LNII) algorithm may be used to determine these input vectors for the N instances of ICs. From the input vectors thus determined, a clustering technique may then be used to identify a representative set R of the input vectors that are similar to each other. The representative set R of similar input vectors may then be used as starting points in some embodiments to determine particular input vectors that will result in leakage current reduction or minimization in any particular new IC that implements the same circuit design.

Accordingly, embodiments are provided for post-silicon leakage current reduction through input vector control (IVC) that takes into account the impact of the MV. Because of the manufacturing variability, the ICs implementing the same circuit design may require different input vectors to achieve their reduced or lowest leakage states. Therefore, by modeling the manufacturing variability through gate-level characterization and by using the representative set R of input vectors as starting points to determining final input vector solutions, different final input solutions may be determined for a large number of ICs in a manner that takes manufacturing variability into consideration.

Some embodiments may provide an article of manufacture that comprises a tangible computer-readable medium (such as a memory or other physical storage device) having stored thereon, computer-executable instructions that, when executed by a computing device, cause the computing device to perform at least some of the operations of method 50. An example embodiment of such a computer-readable medium will be further described below with references to FIG. 8, and an example of such a computing device may include the test apparatus 300 of FIG. 4, which will be described further below with references to FIG. 9.

In some embodiments, a procedure may be used that first characterizes the circuit or a set of circuits of an IC at the gate level in terms of their delay, leakage current, switching power, and/or other operational property or properties. Then, some embodiments may determine the best way to operate the IC when such property or properties of the circuit(s) are known. In the case of leakage current and combinatorial circuits, for example, such operation may involve the selection and application of input vectors. In the case of sequential circuits and leakage current, for example, such operation may involve the selection and application of a sequence of input vectors that bring the flip-flops of the IC into binary states so that the leakage current is reduced. In the case of switching power, for example, such operation may include determination of the minimal supply voltage that is sufficient for correct operation and minimized the energy. Other operational conditions, alternatively and/or additionally to such reduced leakage current, minimized energy, and/or other property associated with the operational condition, may be met by performing such gate-level characterization to identify the proper input(s) to the IC.

In some embodiments, as the IC ages, the gate-level characterization can be repeated so as to find other input vectors to reduce or minimize leakage current, as the leakage current of certain gates (such as highly used gates, for example) increases over time.

Before further describing embodiments of the present disclosure, it should be noted that some embodiments address at least two major challenges so as to provide an efficient technique for selecting input vectors to reduce or minimize leakage current of a plurality of ICs with a same design but differ in manufacturing variability. When gate level characterization is employed, the first challenge addressed by some embodiments is the extraction of the gate-level characteristics of an IC by measuring only the overall leakage power for different inputs of the ICs. The second challenge addressed by some embodiments is the rapid generation of inputs that result in low leakage current for a large number of unique ICs that implement the same circuit design, but are different in the post-manufacturing phase due to manufacturing variability. As will be appreciated from the descriptions to follow, embodiments of the present disclosure effectively address these and other challenge to provide the desired efficient technique.

Example Device Including an IC Having Manufacturing Variability

Figure 2:
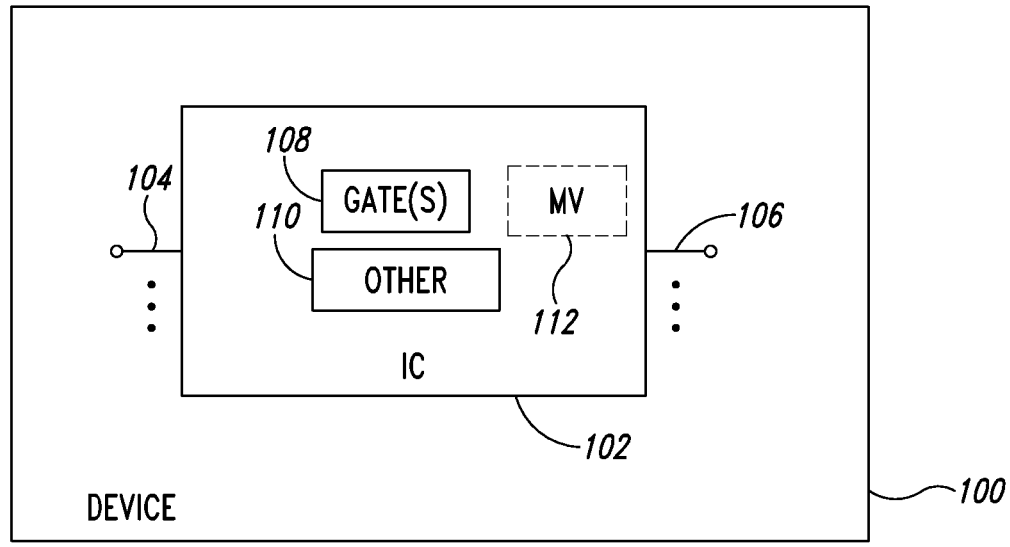
FIG. 2 illustrates an example device that includes an IC suitable to practice various embodiments.

FIG. 2 illustrates an example device 100 that includes an integrated circuit (IC) 102, which is suitable for practicing various embodiments of the present disclosure. The device 100 may include, for instance, a cellular telephone, a laptop computer, a desktop computer, a network device (such as a server), or any other type of stationary or mobile electronic device. In some embodiments, the device 100 may operate in a variety of different operational modes, including a full power mode and a reduced power mode (e.g., such as a sleep mode or idle mode) wherein power supplied to and/or used by the IC 102 may be reduced. In some embodiments, the IC 102 need not enter a sleep mode—the input vectors may be applied to part of the IC 102 or to the whole IC and thus reduce power, while being ready to operate at any moment. Partial application of the input vectors on parts of ICs (such as flip-flops) may be performed in some embodiments where the ICs may be large may have tens and hundreds of mainly independent processors.

The IC 102 of some embodiments may include at least one input terminal 104 and at least one output terminal 106. As will be explained in further detail below, in some embodiments, an input vector is applied to one or a plurality of the input terminals 104 and the resulting leakage current may be measured or otherwise determined at one or a plurality of the output terminals 106.

The IC 102 may include one or more gates 108 and/or other structures 110 that implement a circuit design. For the sake of simplicity of explanation herein, the various structures of the IC 102 will be described in the context of "gates" or "gate-level" (e.g., the gates 108) when describing techniques pertaining to the characterization of the effects of manufacturing variability (MV) and to the reduction or minimization of leakage current. The other structures 110 of the IC 102 may also have an effect on the leakage current and reduction or minimization thereof, but the effect of such other structures 110 are not described in further detail herein, for the sake of brevity.

The IC 102 may have intrinsic MV 112 that results from the manufacturing process. One or both of two types of MV 112 may be present in the IC 102: i) inter-die variations (denoted by $\delta_{inter}$) that include die-to-die fluctuations (e.g., variations between the IC 102 and another IC that implements the same circuit design); and (ii) intra-die variations (denoted by $\delta_{intra}$) that include the fluctuations present inside the single IC 102. It may be assumed that inter-die variations similarly affect all the gates 108 on the single IC 102, while the intra-die variations may differently influence various ICs. The MV 112 is depicted in broken lines in FIG. 1, so as to represent that the variations are not explicitly part of the circuit design and further may fluctuate within the IC 102 and/or between multiple ICs 102 that implement the same circuit design.

Impact of Manufacturing Variability

Figure 3:
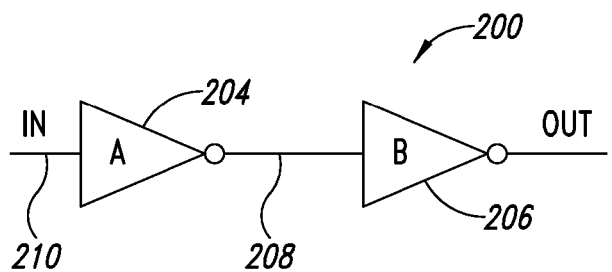
FIG. 3 is a schematic diagram of an example circuit and a table illustrating the possible impact of manufacturing variability (MV) on leakage current in response to application of an input vector.

FIG. 3 is a schematic diagram of an example circuit 200 and a table 202 illustrating the possible impact of MV on leakage current, in response to application of an input vector in accordance with various embodiments of the present disclosure. The design of the circuit 200 may include two inverters A (204) and B (206), where an output terminal 208 of the inverter A forms an input terminal to the inverter B. The second row of the table 202 in FIG. 1 shows the nominal leakage current for an inverter, and the third row of the table 202 shows a ten-time increase in the leakage current as a consequence of the MV.

If, for example, the inverter A has the nominal leakage current, and the inverter B has a ten-fold larger leakage current, a binary input value of 1 provided to an input terminal 210 of the inverter A may yield an overall leakage current of 1227 nA. On other hand, if the inverter B has the nominal leakage current, and the inverter A has a ten-fold larger leakage current, a binary input value of 0 provided to the input terminal 210 may yield an overall leakage current of 2370 nA. Hence, a change in the input value may result in 93% higher leakage current. Thus, MV considerations may play a role in determining the optimum input vectors for leakage power reduction or minimization for each IC.

In accordance with some embodiments, the parameters of the IC 102 may be extracted through gate-level characterization using the power measurements (such as by measuring current at the output terminals 106 of the IC 102), and determination of final input vector (IV) solutions may be performed in some embodiments by applying only a specific set of input vectors and solving a large optimization. In some embodiments, the extracted characteristics may be used for subsequent leakage current optimization.

As will be explained in further detail below, some embodiments employ statistical (clustering) and optimization techniques that include linear programming (LP), integer linear programming (ILP), and large neighborhood iterative improvement (LNII). Clustering is a non-supervised statistical procedure that may identify the topological structure of the data by partitioning it into classes with instances that have similar properties. LP may provide provably optimal polynomial solutions to problems with linear objective function and linear constraints. ILP may address the same problem under the additional constraint that all or a subset of variables may be integers. LNII involves a very large-scale neighborhood search-based optimization technique that may iteratively increase the scope of the neighborhood search so long as the increased scope provides a better solution than the current solution.

Use of Test Apparatus

Figure 4:
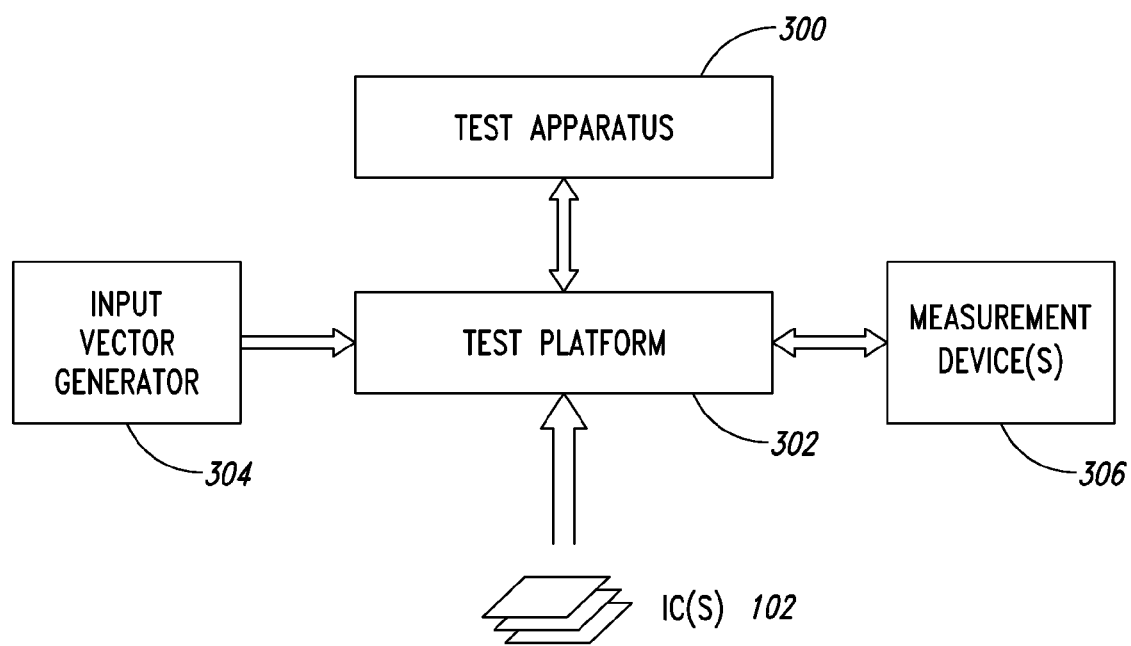
FIG. 4 is a block diagram illustrating the use of a test apparatus to practice various embodiments.

FIG. 4 is a block diagram illustrating the use of a test apparatus 300 to practice various embodiments of the present disclosure. Examples of techniques that can be used by the test apparatus 300 to perform gate-level characterization and to determine IVs that reduce or minimize leakage current for the ICs 102 will be shown and described later below. In some embodiments, the test apparatus 300 may be implemented as a computing device, such as the computing device 900 that will be described with respect to FIG. 9.

The test apparatus 300 may include and/or be coupled to a test platform 302, an input vector generator 304, and at least one measurement device 306. For the sake of clarity and simplicity of explanation hereinafter, the test platform 302, the input vector generator 304, and the measurement device 306 are depicted in FIG. 3 as being separate from the test apparatus 300. However, in some embodiments, one or more of the test platform 302, the input vector generator 304, and the measurement device 306 and/or their functionality may be integrated within the test apparatus 300.

The test apparatus 300 may be located at a manufacturing facility, test facility, or other location where gate-level characterization may be performed and/or where IVs to minimize or reduce leakage current for each IC 102 to a desired level may be determined. For example in an industrial setting, the test apparatus may be located at the manufacturing facility where ICs 102 have been fabricated, and at a next stage of the manufacturing/packaging process, the IV to reduce or minimize leakage current may be determined to configure/program the IC 102 or the device 100 that includes the IC 100, to describe and identify the IV in the product specification documents, and so forth.

The test platform 302 of some embodiments may include a circuit board or other platform on which the ICs 102 to be tested may be mounted. For instance in some embodiments, the test platform 302 may include a standard mounting mechanism for a device-under-test (DUT). Some embodiments of the test platform 302 may include, for example, a base with input and output terminals to respectively couple to the input terminal(s) 104 and the output terminal(s) 106 of the IC 102, for purposes of providing input signals (e.g. input vectors having binary values) to the IC 102, receiving output signals from the IC 102 that represent an amount of leakage current, providing power to the IC 102, providing control signals to the IC 102 (e.g. a control signal instructing the IC 102 to enter a low-power mode), and so forth. Such signals may be provided by the test apparatus 300, the input vector generator 304, and/or by another device (not shown).

The input vector generator 304 may be coupled to the test platform 302, and may generate the IVs that are provided to the IC 102 mounted on the test platform 302. For example, if the IC 102 has four input terminals 104, the input vector generator 304 can be configured to generate an input vector [0001] such that binary values of 0, 0, 0, and 1 may be respectively provided to the four input terminals 104 of the IC 102.

In some embodiments, the input vector generator 304 may include a signal generator configured to generate one or more signals that represent the input vector [0001], for example, that may be applied to the input terminals 104 of the IC 102. Other implementations of the input vector generator 304 may be provided, such as a current source, a voltage source, one or more logic gates or other logic circuitry, a finite state machine, a processor, a random number generator, or any other suitable software and/or hardware component that may be configurable to generate input vectors with different values and to provide the generated input vectors to one or more of the IC 102 mounted on the test platform 302. In some embodiments, the input vector generator 304 may be responsive to the test apparatus 300 to toggle values or to otherwise select and change the input vectors that are provided to the IC 102 mounted on the test platform 302.

In some embodiments, the measurement device 306 may include one or more current meters that are configured to measure current (e.g. leakage current) at the output terminal(s) 106 of the IC 102. The values of leakage current measured by the measurement device 306 may be provided to the test apparatus 300, so that the test apparatus 300 can store and evaluate such values to determine which particular IV resulted in maximum leakage current reduction or minimization for each particular IC 102.

Models Usable for Gate-Level Characterization

According to some embodiments, one or more models for MV, leakage current, and measurement error may be used as part of the gate-level characterization technique. Examples of such models are described next below:

A. Variability Models

According to some embodiments, the MV may be modeled. As previously explained above, process variations may be generally divided into inter-die variations ($\delta_{inter}$) between ICs and intra-die variations ($\delta_{intra}$) within the IC 102.

To model intra-die variations, some embodiments may use equations from L. Cheng et al., "A fast simultaneous input vector generation and gate replacement algorithm for leakage power reduction," in *Annual ACM IEEE Design Automation Conference*, pages 117-120, 2006, and from A. Srivastava et al., "Statistical Analysis and Optimization for VLSI: Timing and Power," in Series on Integrated Circuits and Systems, 2005.

These equations model a parameter p located at (x,y) as $p = \bar{p} + \delta_x x + \delta_y y + \epsilon$, wherein $\bar{p}$ is a nominal value of the parameter p at the (0, 0) die location; $\delta_x x$ and $\delta_y y$ are gradients of the spatial variations of the parameter p in the x and y directions; and $\epsilon$ is a random intra-chip variation component. A multivariate normal distribution (MVN) may be used for modeling the vector of all random components across the chip and the intra-chip correlations among them. Furthermore, the grid model that partitions the space into grids may be used in some embodiments, where devices within the same grid may be highly correlated and devices in further grids may be correlated proportional to their distances.

B. Leakage Current Model

The leakage current may be a function of the process variations. Some embodiments use the leakage model that takes into account the sub-threshold leakage current ($I_{sub}$) and the gate tunneling leakage current ($I_{gate}$). The two leakage currents may be estimated by empirical curve-fitted models as follows:

$$I_{sub} = a_0 w e^{a_1 + a_2 L + a_3 L^2 + a_4 T_{ox}^{-1} a_5 T_{ox}} \quad (1)$$

$$I_{gate} = a'_0 w e^{a'_1 + a'_2 L + a'_3 L^2 + a'_4 T_{ox}^{-1} a'_5 T_{ox}} \quad (2)$$

wherein a and a' denote the fitting parameters; w is the gate width of the transistor; Tox is the gate oxide thickness; and L is the effective gate length due to the short channel effect.

Since both leakage currents may be modeled as exponential functions, both of the leakage currents may be approximated by a lognormal distribution. The full leakage current of the chip may then computed by summing the individual components as follows:

$$I_{total}^{avg} = \sum_{\forall gates i = 1, \ldots, m} I_{sub_i}^{avg} + I_{gate_i}^{avg} \quad (3)$$

wherein m is the total number of components and $I_{sub_i}^{avg}$ and $I_{gate_i}^{avg}$ are computed using the dominant states.

The full-chip leakage distribution may be found by summing up the lognormal distributions of all gates considering spatial correlations. Theoretically, the sum is not known to have a closed form, but may be approximated as a lognormal distribution using for example Wilkinson's method.

C. Measurement Error Model

In some embodiments, current may be measured from the external pins (such as the output terminal 106). Leakage current may be read out in a steady state, where dynamic power may not be present. Environmental conditions, noise, packaging, thermal effects and many other phenomena may affect the external current readings and cause measurement errors. The errors may vary from one design to the next (e.g., because of the differences in size, layout, and environment). The measurement error may be modeled with three different distributions: Gaussian distribution, uniform distribution, and triangular distribution, while the distribution variances may be varied. In some embodiments, linear optimization may reduce or minimize the discrepancy and may not depend on the shape of the measurement error. Any user-defined smooth distribution that has a limited number of discontinuities may be used.

Figure 5:
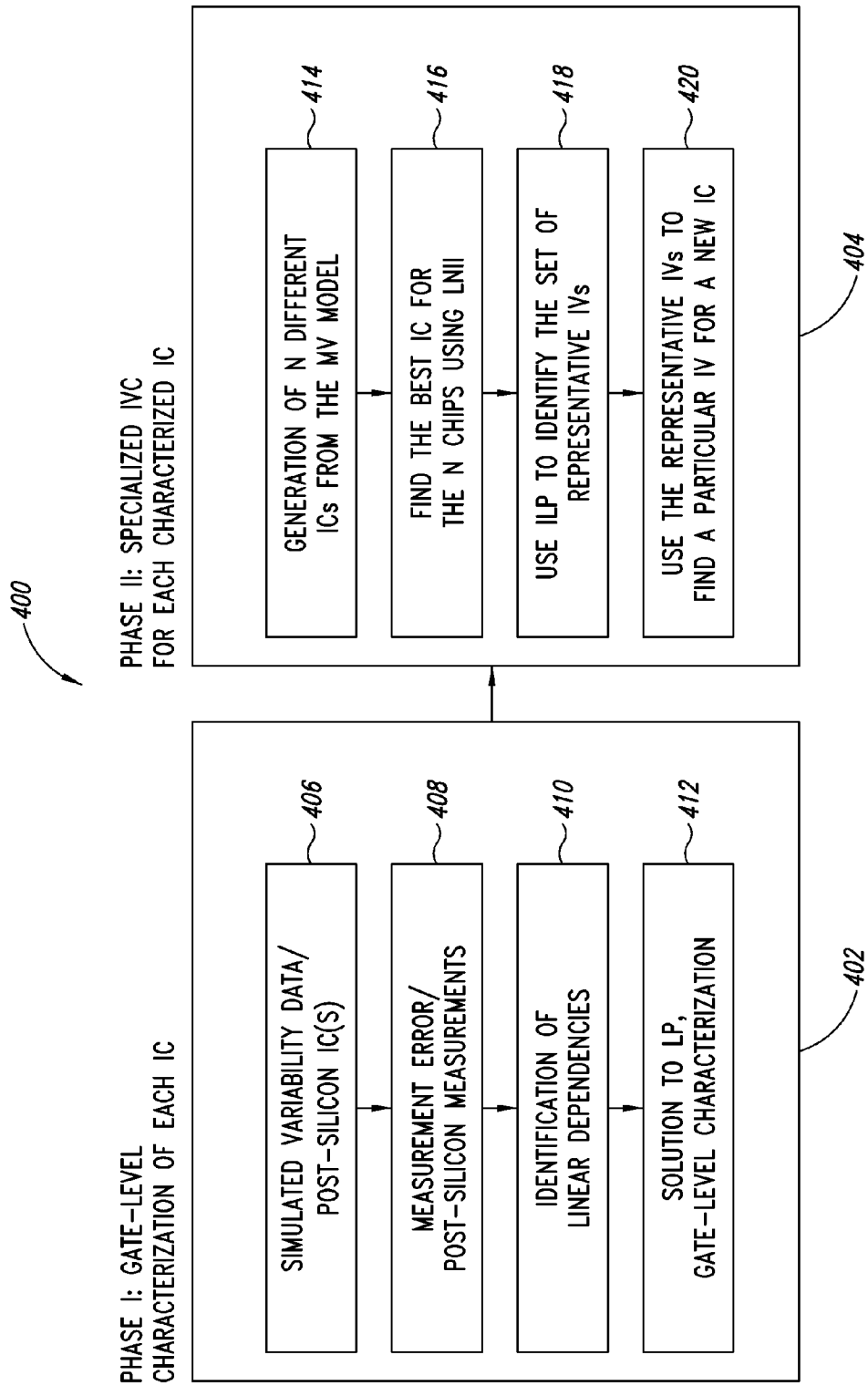
FIG. 5 is a flowchart of embodiments of the method of FIG. 1 including the use of gate-level characterization.

FIG. 5 is a flowchart of embodiments of the method of FIG. 1 including the use of gate level characterization, arranged in accordance with the present disclosure. Embodiments of the method 400 may comprise two phases: (Phase I 402) gate-level characterization phase 402 for each IC 102; and (Phase II 404) specialized IVC for each IC 102. Some embodiments may provide an article of manufacture that comprises a tangible computer-readable medium (such as a memory or other physical storage device) having stored thereon, computer-executable instructions that, when executed by a computing device, cause the computing device to perform at least some of the operations of the method 400. Some example embodiments of such a computing device may be illustrated by the test apparatus 300 of FIG. 3, which is described further below with respect to FIG. 9.

As illustrated, gate-level characterization phase 402 may include block 406 (Simulated variability data/post silicon). At block 406, simulation models for gate-level leakage characteristics for each post-silicon IC 102 may be created. The models may take into account spatial, inter-, and intra-chip correlations. Example details for modeling that may be used in the block 406 according to some embodiments were previously provided above. In an industrial environment where the actual ICs are manufactured and available, the block 406 may be bypassed, and instead, the actual manufactured ICs 102 may be examined to determine the effects of MV.

For various embodiments, gate-level characterization of each IC 402 may also include block 408 (Measurement Error/Post-Silicon Measurements). At block 408, the leakage current measurements for the gate-level variations may be determined via simulation, using the models of the IC 102, while superimposing measurement errors. In an industrial environment where manufactured ICs are available, actual post-silicon measurements of the leakage current may be taken on a manufactured IC 102 at the block 408.

In various embodiments, gate-level characterization of each IC 402 may also include block 410 (Identification of linear dependencies). At block 410, once the leakage current measurements are available, a linear programming (LP) may be formulated to determine the gate-level characterizations. In various embodiments, each measurement of leakage current may be used to form one LP constraint, and an objective function of the LP may be a reduction or minimization of a sum of an absolute discrepancy between the leakage current computed for the computed gate scaling factors and the corresponding measurement of leakage current. In various embodiments, at this stage, the constraints may be examined for identification of linear dependencies that may prevent the generation of a correct solution for the LP.

In various embodiments, gate-level characterization block 402 may include block 412 (Solution to LP, Gate-level characterization). At the block 412, the LP may be solved, and the results obtained by solving the LP may be evaluated in terms of the expected gate-level characterization error. If the accuracy is not acceptable (e.g. the actual gate-level characterization error is greater than the expected gate-level characterization error), block 408 may be repeated to obtain additional measurements, and the number of constraints may be increased at the blocks 410.

In various embodiments, specialized IVC for each characterized IC 404 may include block 414 (Generation of N Different ICs from the MV Model). At block 414, a relatively large number (denoted by N) of model instances corresponding to manufactured ICs 102 of the circuit design that differ from each other because of MV, may be generated. The N model instances of the ICs 102 may incorporate the gate-level characteristics that were obtained at phase 402, and this incorporation of the gate-level characteristics therefore enable the N instances to each particularly model MV and the corresponding different leakage currents impacted by MV.

In alternate embodiments, block 414 may use N actual manufactured ICs 102 as starting points, alternatively or additionally to generating N model instances of the ICs 102 that differ due to MV.

In various embodiments, specialized IVC for each characterized IC may include block 416 (Find the best IC for the N chips using LNII). At block 416, an attempt may be made to find, for each respective one of the N instances of ICs 102, an IV that results in leakage power reduction or minimization. In various embodiments, a large neighborhood iterative improvement (LNII) algorithm may be used at the block 416 to determine the IV for each respective one of the N instances of ICs 102. Further details of an embodiment of the LNII algorithm are provided later below.

In various embodiments, specialized IVC for each characterized IC may include block 418 (Use ILP to identify the set of representative IV). At block 418, similar IV solutions may be identified using a clustering technique, so as to build a representative set of IVs that resulted in reduction or minimization of leakage current for the N instances of ICs 102. According to some embodiments, the clustering technique's measure of "similarity" may be a Hamming distance between the IVs for a pair of ICs. The similarity between any two ICs may be calculated and a small set of representative input vectors (denoted by R) may be selected, in such a way that a non-selected IC has at least one other IC with a representative IV within the specified Hamming distance. Leveraging on the relatively small size of the representative IVs and their structure, integer linear programming (ILP) may be used in various embodiments to solve this condition. Further details of some embodiments of the clustering technique are provided later below.

Other examples of a clustering technique that may be used in some embodiments may include one or more N-means, nearest neighbor, simulated annealing with a variety of objective functions, and/or other clustering techniques.

In various embodiments, specialized IVC for each characterized IC may include block 420 (Use the representative IVs to find a particular IV for a new IC). In a block 420, various embodiments iteratively apply the LNII algorithm R times, so as to identify the IV that reduces or minimizes the leakage current for a particular newly characterized IC 102. For each such particular IC, the block 420 may start from one of the R representative IVs, and the LNII algorithm may iteratively execute until a particular final IV is found that results in a minimum leakage current or reduction to a predetermined or desired level for the particular IC 102. Starting from the representative set R of IVs, rather than starting from any random IV, may reduce the runtime in determining the particular IV that reduces or minimizes leakage current for the particular IC 102.

A. Gate-Level Characterization Details of Phase 402

In some embodiments, gate-level characterization in the phase 402 from FIG. 5 above may be performed using non-destructive IC characterization, so as to enable characterization of each gate 110 and interconnect within a pertinent IC 102. Some embodiments conduct measurements that can be obtained from the external terminals 104 and 106 of the IC 102 (e.g. I/O and power pins).

Non-destructive gate-level characterization may be formulated in the following way according to some embodiments. Given an IC 102 implementing a documented circuit design, the gate leakage currents may be measured at the block 408 when the IC 102 is in the low-power mode (e.g. an idle mode or a sleep mode). These types of measurements belong to a class of measurements, where in different experiments, the same gate 108 may be provided with different weight factors. The standard or expected leakage power of a gate 108 for different states may be mapped in a look-up table in some embodiments. The entries in the look-up table may then used to create independent equations that connect characteristics of a gate 108 to the measurements of the global power or path delays.

Figure 6:
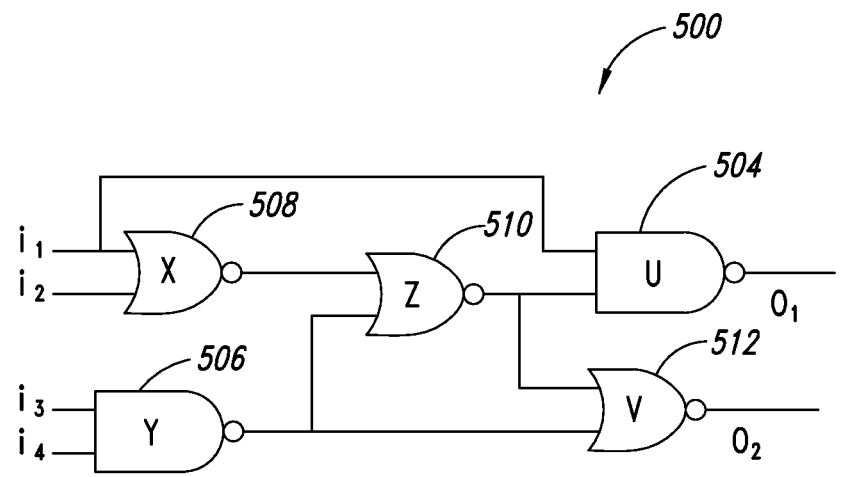
FIG. 6 is a circuit diagram and table illustrating aspects of gate-level characterization.

FIG. 6 is a circuit diagram and table illustrating aspects of gate-level characterization, in accordance with various embodiments of the present disclosure. Example circuit 500 may be one of the circuits present on the IC 102. Table 502 shows the representative inputs to the gates 108 of the circuit 500. In this example, the gate-level behavior of the circuit 500 is derived from two NAND gates U (504) and Y (506) and three NOR gates X (508), Z (510), and V (512). The table 502 shows the transitions at the output of each gate X, Y, Z, U, and V depending on the previous inputs and the current inputs. Look-up tables for the leakage current for standard NAND/NOR gates may be readily available and may be used. For the sake of brevity, the effect of leakage current due to interconnects are not considered in this example, but may be factored into the computation in a straightforward way.

For the example input states/signals $(i_1, i_2, i_3, i_4)=0000$ and 1011 provided to the circuit 500, the leakage current consumption of the circuit 500 may be as shown in the first two lines of Equation 4 below. In Equation 4, P denotes the measured power consumption (current) for each input state, while E is the error in measuring the current/power.

$$P(0000)+E_1=s_X P_{NOR}(00)+s_Y P_{NAND}(00)+s_Z P_{NOR}(11)+s_U P_{NAND}(00)+s_V P_{NOR}(01);$$

$$P(1011)+E_2=s_X P_{NOR}(10)+s_Y P_{NAND}(11)+s_Z P_{NOR}(00)+s_U P_{NAND}(11)+s_V P_{NOR}(10);$$

$$P(\ldots)+E_i=\ldots; i=3\ldots,M \quad (4)$$

In Equation 4, $P_{NOR}$ and $P_{NAND}$ are the leakage currents of standard NOR and NAND gates that can be extracted from look-up tables as mentioned above. The variables $s_X$, $s_Y$, $s_Z$, $s_U$, and $s_V$ denote the scaling factors of the gates X, Y, Z, U, and V, when compared to the standard gates of each type. The linear system comprising of power equations for M different inputs can be written in a similar way. The unknown quantities of Equation 4 are the scaling factors ($s_X$, $s_Y$, $s_Z$, $s_U$, and $s_V$) of the gates X, Y, Z, U, and V and the measurement errors ($E_1$, $E_2$, ..., $E_I$).

By solving the optimization problem of reducing or minimizing a metric of errors, say $L_1$ norm of the errors $$\left(\text{i.e., } \min \sum_{m=1}^{M} |E_m|\right),$$

subject to the linear system of M equations, the respective scaling factor $s_X$, $s_Y$, $s_Z$, $s_U$, and $s_V$ of each gate X, Y, Z, U, and V can be found.

The created equations for current at the gate level are linear, and to create a new equation that is, with a high probability, independent from the other equations, the input test vectors may be changed and new measurements may be conducted. The L1 norm may be used as an objective function (OF) that is non-linear. The non-linear OF may be converted to a linear one by introducing m new auxiliary variables $E_{absm}$, and adding 2m new constraints: for each m, $E_{absm} \geq E_m$ and $E_{absm} \geq E_m$.

The linearized OF would then be:

$$\min \sum_{m=1}^{M} E_{absm}.$$

To ensure that the above linear programming (LP) formulation is solvable, some embodiments measure as many independent equations (rows) as the number of variables. Also, some embodiments ensure that there are no two or more columns that are linearly scaled versions of each other, since in that case the formulation may not have a unique solution. A final operation before solving the LP may include identifying the variables that are also a linear combination of a subset of other variables in all constraints. Sets of these variables may be grouped together into a single new variable in the constraint. After solving the LP, the scaling factor may be divided for each new variable, equally between the variables that were used to form the scaling factor.

In some embodiments, the CPLEX® software package from ILOG may be used to solve the LP.

B. Specialized IVC for Each Characterized IC Details of Phase 404

An embodiment of one or more algorithms for determining specialized IVC for each characterize IC, as represented in phase 404 of FIG. 5, will now be further described herein.

The outcome of the gate-level characterization of above-described phase 402 may provide the estimated scaling factor(s) of the gates 108 that can be used for modeling the exact post-silicon leakage variations of one or more of the ICs 102. From the thus-modeled ICs 102, an IV may be selected that minimizes or reduces leakage current to a desired level based on the estimated gate-level characteristics.

Initially, the sources of difficulty in addressing the post-silicon IVC problem and a further description of the overall algorithmic approach of phase 404 are provided herein. Next, an embodiment of a very Large-scale Neighborhood search Iterative Improvement-based (LNII) algorithm for solving the optimization that finds the best IV is described. A description follows of an embodiment of a clustering approach that finds a small set of representative IVs. The representative set of IVs serves as the starting point for invoking the LNII algorithm (for each new IC with unique gate characteristics) along with a strategy for fast optimization of each unique instance of the IC.

1. Problem Formulation and Strategy

Post-silicon leakage current reduction or minimization using IVC may be defined in the following way according to some embodiments:

Instance: Given a combinational netlist with G logic gates $g_i$, with no cycles and a set S of scaling coefficients $s_i$ corresponding to each gate $g_i$, ($i=1, \ldots, G$). Also, given a table T of nominal values for leakage current consumption with entries $t_{k,j}$, where k is the gate type (e.g. NAND, NOR) and j is the ordered input combination to the gate. The coefficient $s_i$ indicates the scaling ratio between the leakage power of the gate $g_i$ to the nominal value of the leakage for the same gate type and the same input from T. The assumption may be that the ratio is the same over different inputs. Note that, if the ratio is not constant over all gate inputs, the approach can be generalized by introducing a new two-dimensional scaling factor $s'_{i,\,j}$ that characterizes the scale of the gate $g_i$ for the input j, where j belongs to the set of the ordered inputs.

Objective: Generate the logic values assigned to the primary inputs of the IC 102 (e.g. generate the binary 1 or binary 0 values of the IV) so that the sum of the leakage currents for all of the gates 108 may be minimized or reduced to a desire level.

Complexity: A majority of power optimization and synthesis problems may be difficult because of their non-deterministic polynomial (NP)-complete structure. Post-silicon leakage power reduction or minimization using MV-aware IVC has an additional challenge: a large number of instances of the IC 102 have to be solved. For example, it is common that for each circuit design, millions of ICs 102 implementing the circuit design may be manufactured. To address these challenges, some embodiments follow the paradigm of "separation of concerns." Some embodiments also emphasize the software and results reusability paradigms. At an intuitive level, it can be expected that a significant number of ICs 102 with similar gate characteristics have identical or similar best IVs for minimizing or reducing leakage currents to a desire level.

Based on the "separation of concerns" paradigm, some embodiments of a method to determine the IV that minimizes o reduces leakage current to a desired level in the IC 102 may be based on the following sequence of operations, which are also represented in FIG. 5 previously described above. Specialized IVC for each characterized IC Phase (block 404):

1. Find the best IC for the N chips using LNII (block 416).
2. Use ILP to identify the set of representative IVs (block 418); and
3. Use representative IVs to find a particular IV for a new IC (block 420).

With respect to N and as explained previously above, the block 414 of FIG. 5 may initially involve the generation of N model instances of the ICs 102 that differ from each other due to MV. These generated N model instances may include the gate-level characteristics as determined by phase 402 of FIG. 5. By including the determined gate-level characteristics in the N model instances, the subsequent determination of the IV for each respective IC 102 may take into account the MV that affect the gate-level characteristics.

The value of N may be set to 100, for example, or any other suitable higher or lower value. For instance, the value of N may be set to higher values for circuits with a larger range of variations. In some embodiments that implement software or other computer-readable instructions, the software has a modular structure to facilitate reusability, and the optimization between the modules can be coordinated.

2. Find the Best IC for the N Chips using LNII (Block 416)

As explained above, after the N instances of the IC 102 are generated at the block 414, the subsequent block 416 may involve the generation of initial individual IV solutions for the N instances of the ICs 102. Generation of the individual IV solutions for the N instances of the ICs 102 at the block 416 has at least three potential purposes: (i) creation of an initial starting point of IVs to be used for the consequent optimization (e.g. determination of other IVs) for a large number of ICs 102; (ii) learning the solution space of IVs in terms of topology and duration of execution of the LNII algorithm; (iii) comparison of the IVC performance with the IVs resulting from the restricted search-based LNII, for the new ICs.

Figure 7:
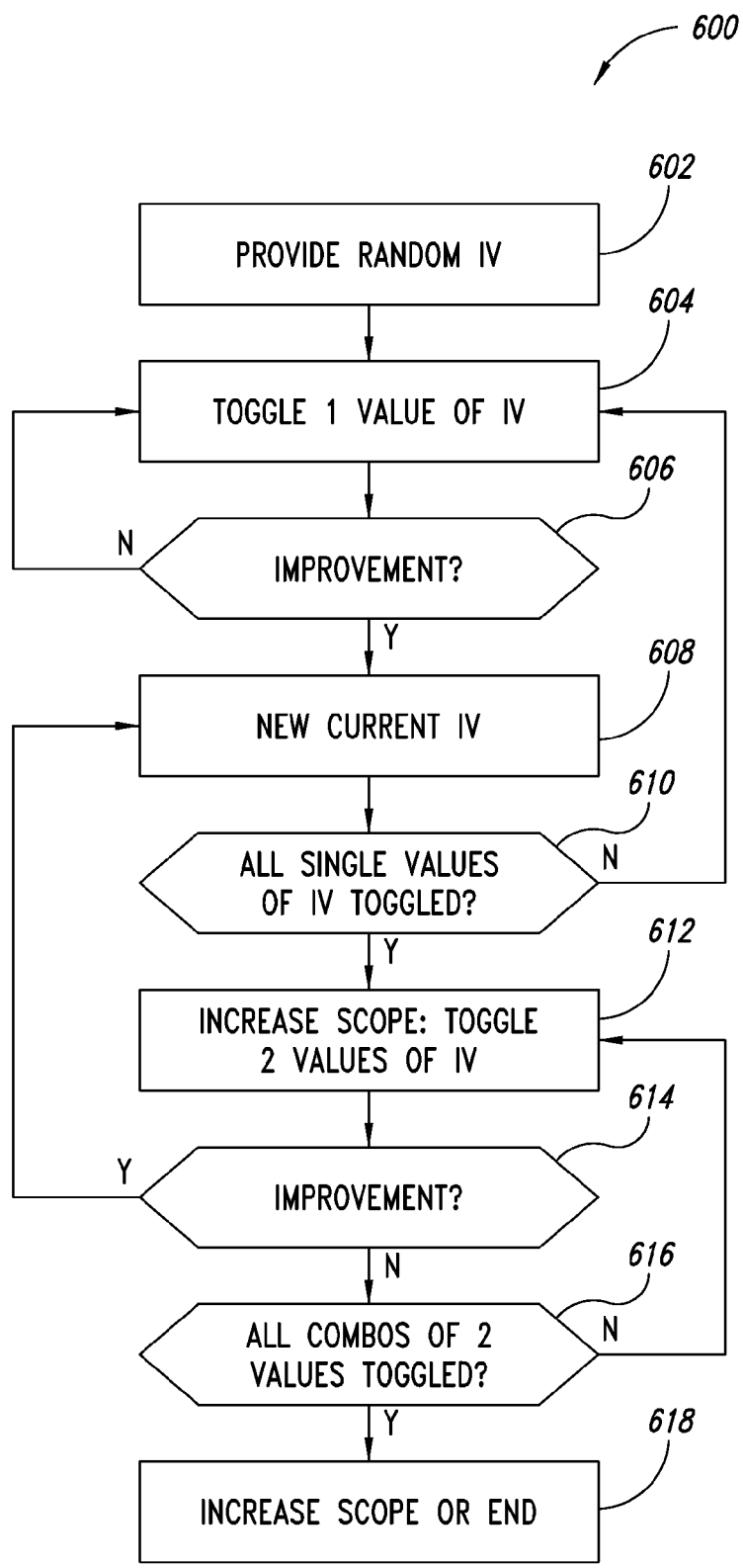
FIG. 7 is a flowchart of a method for determining initial IVC solutions for ICs using a large neighborhood iterative improvement (LNII) algorithm.

FIG. 7 is a flowchart of a method for determining initial IVC solutions for ICs using a large neighborhood iterative improvement (LNII) algorithm, in accordance with various embodiments of the present disclosure. According to the depicted embodiment, an LNII algorithm may be used by the method 600 to determine the IV for each of the N instances of the IC 102.

Some embodiments of the LNII algorithm start at a block 602 (Provide random IV). At block 602, a random IV may be selected temporarily as the current solution. For example, in an implementation where there are 4 input values in an IV, the initial random IV might be a string of binary 0s of the form [0000]. Next, the LNII algorithm may proceed to block 604 (Toggle 1 value of IV). At block 604, one of the values in the current solution may be switched or toggled (e.g. changing a single input value of the current IV from [0000] to [0001]). After block 604, the LNII algorithm proceeds to block 606 (Improvement?). At block 606, it may be determined whether there is a corresponding improvement/reduction in the leakage current.

If no improvement in the leakage current is detected at the block 606, then the LNII algorithm returns to the block 604, where another input value of the current IV may be toggled. If an improvement in the leakage current is detected at the block 606, then LNII algorithm proceeds to block 608 (New current IV). At block 608, the IV having the thus-toggled input value may be updated/designated as the new current IV solution.

From block 608, the LNII algorithm may proceed to block 610 (All single values of IV toggled?). At block 610, whether all single values of the IV have been toggled may be checked. If other single input values of the IV remain to be toggled (no branch), then the procedure as described above for blocks 604-608 may be iteratively repeated by the LNII algorithm until no alternation of single input values improves the current solution.

If there is no toggling of single input values that improves the current solution (yes branch), the LNII algorithm proceeds to block 612 (Increase scope, toggle 2 values of IV). At block 612, the search space may be enlarged, by looking for an improvement where two input values are simultaneously toggled. The LNII algorithm may then proceed to block 614 (Improvement?). At block 614, assessment may be made again to determine whether an improvement has been found via toggling two inputs. If improvement is found, the LNII algorithm returns to block 608 setting the latest toggled value as the new current IV. From here, the LNII algorithm continues with alternation of a single input values at blocks 604-606 and blocks 608-610 as earlier described.

If no improvement is found at block 614, the LNII algorithm may proceed to block 616 (All combos of 2 values toggled). At block 616, a determination may be made whether all combinations of 2 values have been toggled. If combinations of 2 values have not all been toggled, the LNII algorithm may return to block 612, and may continue as described earlier. If combinations of 2 values have all been toggled, the LNII algorithm may proceed to block 618 (Increase scope or end) where the LNII algorithm may increase the scope again or terminate.

The LNII algorithm of FIG. 6 according to some embodiments may be summarized by the following pseudocode:

| LNII algorithm |
| --- |
| 1.     Generate a random initial solution; |
| 2.     while (stopping criteria-overall == NO) { |
| 3.         scope = 1; |
| 4.         while (stopping criteria-scope == NO) { |
| 5.             search for better solution within the scope; |

| | LNII algorithm |
|---|---|
| 6. | if (no-better-solution is found); |
| 7. | scope++; |
| 8. | } |
| 9. | } |

While an LNII algorithm may be used in some embodiments, some other embodiments may use another type of iterative improvement algorithm, such as one or more simulated annealing, genetic algorithm, taboo search, etc. Thus, wherever some embodiments may be described herein as using an LNII algorithm, some other embodiments may be provided that use such other types of iterative improvement algorithm.

Referring back to FIG. 5, as described previously above with respect to phase 404, some embodiments may perform a clustering technique at block 418 to identify a set R of representative IVs, from the IVs (N total) determined by the LNII algorithm at the block 416 as described above, that have the property that every other IC 102 of the N instances of ICs has a low leakage current IV solution that is only a short Hamming distance from at least one representative IV from the set. The Hamming distance between a pair of IVs may be calculated as the number of binary inputs that have to be altered to produce one of the solutions from another. Although numerous statistical clustering techniques may be used in other embodiments, some embodiments may use an integer linear program (ILP)-based technique to leverage the relatively small number of instances and the relatively sparse structures of the constraints.

Some embodiments of the clustering approach may use an integer linear program (ILP) such as formulated below:

Given: A set of N input vectors I with elements $I_n$, n=1, ..., N; a number K; a Hamming distance matrix $H_{(N \times N)}$ with elements $h_{nm}$, s.t.

$h_{nm} = \{1,$ If Hamming$(I_m, I_n) \leq K$ 0;

$h_{nm} = \{0$ otherwise $\quad (5)$

Variables: a vector $X_{(N)}$ with elements $x_n$ s.t.

$x_n = \{1,$ If input vector $I_n$ is in the representative set;

$x_n = \{0;$ otherwise $\quad (6)$

Objective Function: The objective function minimizes the number of representative inputs in the set $$\left(\text{i.e., for } n = 1, \ldots, N, \min \sum_n I_n\right).$$

Constraints: The set of constraints ensures that every input vector is either in the representative set, or it has a Hamming distance smaller than K to an input vector in the representative set. For $$n = 1, \ldots, N, I_n + \sum_m H_{mn} I_m \geq 1.$$

Still referring to FIG. 5, next, in some embodiments of phase 404 of the method 400, may involve the determination of a particular IV solution for a new IC 102 at the block 420, once the representative set R is made available by the clustering performed in the block 418. For this task, an LNII algorithm similar to that described above with respect to FIG. 7 may be used that starts from the IVs in the representative set R. Specifically for each particular new IC 102, one of the IVs from the set R may be used as the starting point for the LNII algorithm and the values of that starting IV may be toggled as described above. In an embodiment, each of the IVs from the set R may be used as a starting point for the LNII algorithm for the particular new IC 102, such that the LNII algorithm may be repeated R times for each particular individual IC 102. The particular IV having the final toggled value(s) that reduces or minimizes leakage current may be selected as the final solution for that particular new IC.

In another embodiment, alternatively or additionally to using the representative IVs from the set R, some embodiments may use the gate characteristics to identify the best starting point.

Article of Manufacture

Figure 8:
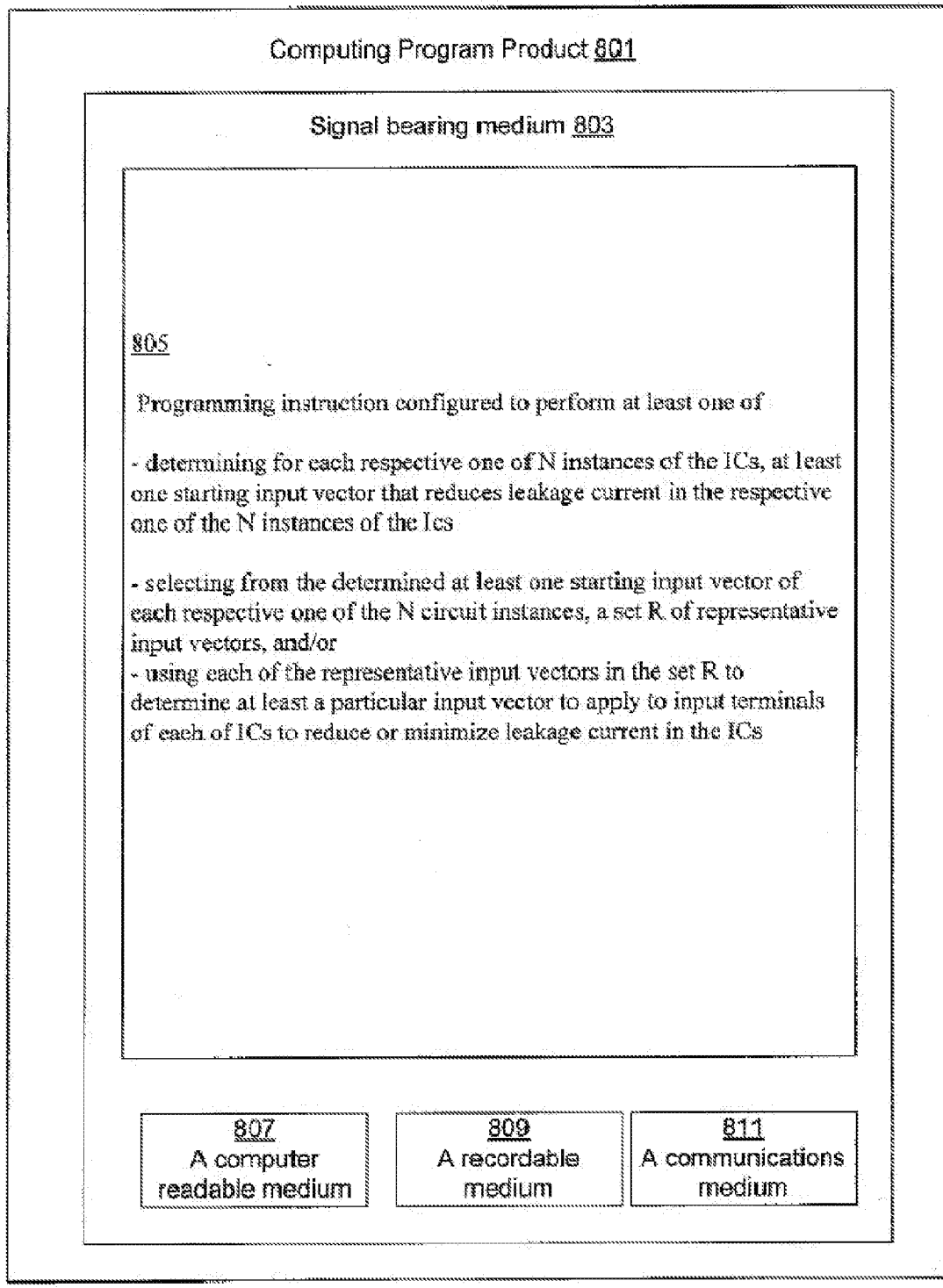
FIG. 8 illustrates an article of manufacture including a computing program product.

FIG. 8 illustrates an example article of manufacture having a computing program product 801 in accordance with various embodiments of the present disclosure. In various embodiments, computing program product 801 may comprise a signal bearing medium 803 having programming instructions stored therein. The computing signal bearing medium 803 may be, for example, a compact disk (CD), a digital versatile disk (DVD), a solid-state drive, a hard drive, or other appropriate type of data/instruction storage medium. The computing signal bearing medium 803 may have stored therein in a number of programming instructions 805. The programming instructions 805 when executed by a processor of an apparatus may cause the apparatus to determine for each respective one of N instances of the ICs, at least one starting input vector that reduces leakage current in the respective one of the N instances of the ICs. In various embodiments, when executed, the programming instructions 805 may also cause the apparatus to select from the determined at least one starting input vector of each respective one of the N circuit instances, a set R of representative input vectors. In still other or same embodiments, when executed, the programming instructions 805 may also cause the apparatus to use each of the representative input vectors in the set R to determine at least a particular input vector to apply to input terminals of each of ICs to reduce or minimize leakage current in the ICs. Embodiments are not limited to any type or types of computing program products.

In various embodiments, the signal bearing medium 803 may include a computer readable medium 807, including but not limited to a CD, a DVD, a solid-state drive, a hard drive, computer disks, flash memory, or other appropriate type of computer readable medium. In various embodiments, the signal bearing medium 803 may also include a recordable medium 809, including but not limited to a floppy disk, a hard drive, a CD, a DVD, a digital tape, a computer memory, a flash memory, or other appropriate type of computer recordable medium. In various embodiments, the signal bearing medium 803 may include a communications medium 811, including but not limited to a fiber optic cable, a waveguide, a wired or wireless communications link, etc.

Computing System

Figure 9:
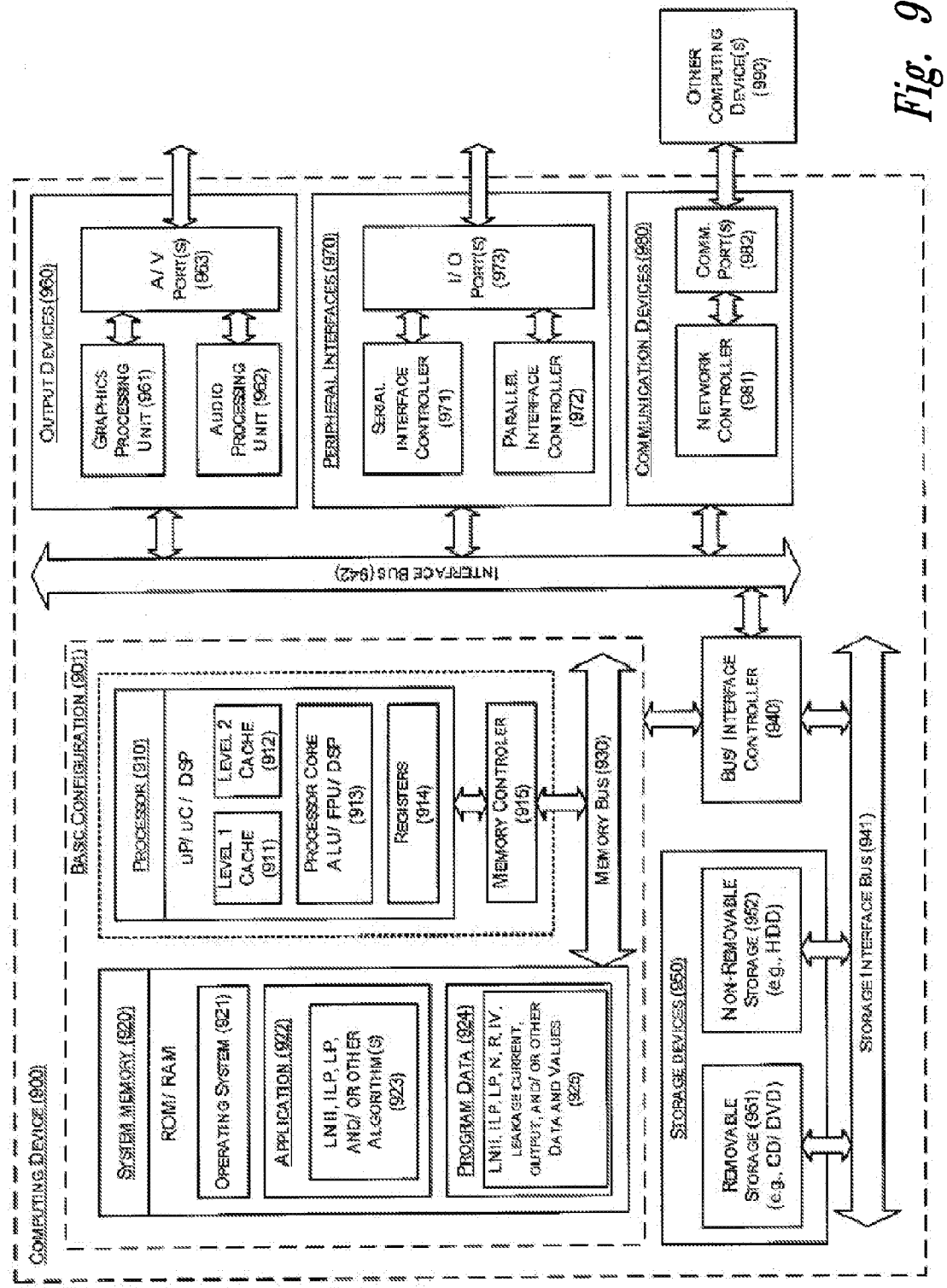
FIG. 9 illustrates an example computing system that may be suitable for practicing various embodiments; all arranged in accordance with embodiments of the present disclosure.

FIG. 9 is a block diagram illustrating an example computing device 900 that is arranged for selecting input vectors for reducing or minimizing leakage current of a number of IC in view of MC, in accordance with the present disclosure. In a very basic configuration 901, computing device 900 typically includes one or more processors 910 and system memory 920. A memory bus 930 may be used for communicating between the processor 910 and the system memory 920

Depending on the desired configuration, processor 910 may be of any type including but not limited to a microprocessor (µP), a microcontroller (µC), a digital signal processor (DSP), or any combination thereof. Processor 910 may include one more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof. An example memory controller 915 may also be used with the processor 910, or in some implementations the memory controller 915 may be an internal part of the processor 910.

Depending on the desired configuration, the system memory 920 may be of any type including but not limited to volatile memory (such as RAM), non-volatile memory (such as ROM, flash memory, etc.) or any combination thereof. System memory 920 may include an operating system 921, one or more applications 922, and program data 924. Application 922 may include programming instructions 923 to perform the operations associated with method 100. In particular, the programming instructions may include instructions for performing the gate-level characterizations, and specialized IVC selection described for embodiments of method 100 (method 400), including instructions for performing the earlier described LNII, ILP, LP algorithms. Program Data 924 may include data associated the ICs, the input vectors selected for the IC, and programming instructions 923.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces 970 include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

Details of experiment set-ups and experimental results in connection with performing non-invasive gate-level characterization of ICs and in connection with performing MV-aware IVC to reduce or minimize leakage current are disclosed in Y. Alkabani et al., "Input vector control for post-silicon leakage current minimization under manufacturing variations," Technical Report, Rice University, Electrical and Computer Engineering Department, 2008, and in Y. Alkabani et al., "Input vector control for post-silicon leakage current minimization in the presence of manufacturing variability," in *Annual ACM IEEE Design Automation Conference*, pages 606-609, Jun. 8-13, 2008. For the sake of brevity, details of such experiments are not provided herein.

In conclusion, embodiments have addressed post-silicon leakage current reduction or minimization using the selection of an input vector for each IC that is suited the IC's specific gate-level characteristics that are consequences of the MV. The embodiments address at least two technical issues: (1) extraction of gate-level characteristics of an IC using a linear programming (LP) formulation, and (2) rapid generation of high-quality IV solutions for large number of unique ICs by using coordinated application of statistical clustering and a LNII algorithm. Experimental results demonstrate improvements by an average factor of more than 10% can be achieved over the previously published techniques that generate input vectors for leakage power optimization without considering manufacturing variability.

All of the above U.S. patents, U.S. patent application publications, U.S. patent applications, foreign patents, foreign patent applications and/or non-patent publications referred to in this specification and/or listed in the Application Data Sheet, are incorporated herein by reference, in their entirety.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a storage medium or storage media. This storage media, such as CD-ROMs, computer disks, flash memory, or the like, for example, may have instructions stored thereon, that, when executed by a system, such as a computer system, computing platform, or other system, for example, may result in execution of a processor in accordance with claimed subject matter, such as one of the implementations previously described, for example. As one possibility, a computing platform may include one or more processing units or processors, one or more input/output devices, such as a display, a keyboard and/or a mouse, and one or more memories, such as static random access memory, dynamic random access memory, flash memory, and/or a hard drive.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

In the preceding description, various aspects of claimed subject matter have been described. For purposes of explanation, specific numbers, systems and/or configurations were set forth to provide a thorough understanding of claimed subject matter. However, it should be apparent to one skilled in the art and having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now, or in the future, occur to those skilled in the art. It is, therefore, to be understood that the appended claims are intended to cover all such modifications and/or changes as fall within the true spirit of claimed subject matter.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that individual function and/or operation within such block diagrams, flowcharts, or examples may be implemented, individually and/or collectively, by a wide range of hardware, software, firmware, or virtually any combination thereof. In some embodiments, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. A method for selecting one or more input vectors to reduce or minimize leakage current in particular integrated circuits (IC) having a circuit design, the method comprising, by a computer:
   determining, by a device, for each respective one of a plurality of ICs having the same circuit design, at least one starting input vector that reduces leakage current in the respective one of the ICs;
   selecting, by the device, from the determined at least one starting input vector of each respective one of the ICs, a set of representative input vectors; and
   using, by the device, each of the representative input vectors in the set to determine at least a particular input vector to apply to input terminals of the particular IC to reduce or minimize leakage current in the particular IC.

2. The method of claim 1, wherein said determining at least the particular input vector to apply to input terminals of the particular IC to reduce or minimize leakage current in the particular IC comprises determining at least a particular input vector to apply to a portion of the particular IC to reduce power of the particular IC.

3. The method of claim 1, wherein said determining at least the particular input vector to apply to input terminals of the particular IC to reduce or minimize leakage current in the particular IC comprises determining at least a particular input vector to apply to input terminals of the particular IC during a sleep mode of the particular IC.

4. The method of claim 1, wherein said determining at least one starting input vector that reduces leakage current comprises performing, by the device for each of the ICs, an iterative improvement algorithm that performs a search for input vector solutions.

5. The method of claim 4, wherein said performing the iterative improvement algorithm comprises performing a large-scale neighborhood iterative improvement-based (LNII) algorithm.

6. The method of claim 5, wherein said performing the LNII algorithm comprises:
   generating a first input vector and designating the generated first input vector as a new current input vector;
   toggling a first value of the new current input vector, and determining whether the current input vector, having the toggled first value, results in improvement in reduction of leakage current in each of ICs;
   if said determining determines that there is improvement in reduction of leakage current, designating the current input vector, having the toggled first value, as the new current input vector;
   repeating said toggling, determining, and designating until the current input vector provides no improvement in reduction of leakage current in the ICs;
   if there is no further improvement in reduction of leakage current in after said repeating, simultaneously toggling the first value and a second value of the current input vector, and determining whether the current input vector, having the simultaneously toggled first and second values, results in improvement in reduction of leakage current in the ICs;

if said determining, whether the current input vector having the simultaneously toggled first and second values results in improvement in reduction of leakage current in the ICs, determines that there is improvement in reduction of leakage current, designating the current input vector, having the simultaneously toggled first and second values, as the new current input vector; and repeating said toggling, determining, and designating until a final input vector is determined that minimizes or reduces leakage current to a predetermined level in the ICs;

wherein selecting the set of representative input vectors includes selecting from among final input vectors of the ICs.

7. The method of claim 1, wherein said selecting the set of representative input vectors comprises selecting input vectors for the set that are similar to each other using a clustering technique.

8. The method of claim 7, wherein said selecting the set of representative input vectors using the clustering technique comprises:

setting a Hamming distance; and identifying the set of representative input vectors so that each of the ICs has an input vector that is within the Hamming distance from at least one of the representative input vectors in the set.

9. The method of claim 1, further comprising performing or causing to be performed, by the device, a gate-level characterization of each of the ICs to determine an effect of manufacturing variability on the circuit design.

10. The method of claim 1, wherein said using each of the representative input vectors in the set to determine at least the particular input vector to apply to the input terminals of the particular IC comprises:

performing an algorithm that uses each of the representative input vectors from the set as a starting point, and that then iteratively toggles values of each of the representative input vectors until the particular input vector is identified.

11. The method of claim 1, wherein said using each of the representative input vectors in the set to determine at least the particular input vector comprises using each of the representative input vectors in the set to determine at least the particular input vector that includes binary input values that are respectively applied to the input terminals of the particular IC.

12. An article of manufacture, comprising:

a non-transitory tangible computer-readable medium; and a plurality of computer-executable instructions stored on the tangible computer-readable medium, wherein the computer-executable instructions, when executed by a processor of an apparatus, cause the apparatus to perform a method including:

determining, for each respective instance of a same circuit design, at least one starting input vector that reduces leakage current in the respective one of the instances of the IC;

selecting, from the determined at least one starting input vector of each respective one of the instances, a set of representative input vectors; and using each of the representative input vectors in the set to determine at least one particular input vector to apply to input terminals of an integrated circuit (IC) having the circuit design to reduce or minimize leakage current in the IC.

13. The article of manufacture of claim 12, wherein the computer-executable instructions, when executed, cause the apparatus to perform:

applying, for each of the instances, a large-scale neighborhood iterative improvement-based (LNII).

14. The article of manufacture of claim 12, wherein the computer-executable instructions, when executed, cause the apparatus to perform:

applying an algorithm that uses each of the representative input vectors from the set as a starting point, and that then iteratively toggles values of each of the representative input vectors until the at least one particular input vector is identified.

15. The article of manufacture of claim 12, wherein the computer-executable instructions, when executed, cause the apparatus to perform:

clustering input vectors from the set that are similar to each other according to a Hamming distance.

16. The article of manufacture of claim 12 wherein the tangible computer-readable medium further has stored thereon computer-executable instructions that, when executed by the processor, cause the apparatus to perform the method that additionally comprises:

performing a gate-level characterization to determine an effect of the manufacturing variability on the circuit design.

17. An apparatus, comprising:

a processor; and a processor-readable storage medium coupled to the processor and having stored therein a plurality of programming instructions configured to be executed by the processor, wherein when executed, cause the apparatus to:

determine, for each integrated circuit (IC) including a same circuit design, at least one starting input vector that reduces leakage current in the respective IC of the plurality of ICs, and for selecting, from the determined at least one starting input vector of the respective ICs, a set of representative input vectors; and apply or cause to be applied each of the representative input vectors in the set to input terminals of a particular IC having same said circuit design to obtain at least one particular input vector that minimizes or reduces leakage current in the particular IC.

18. The apparatus of claim 17, wherein when executed, the programming instructions cause the apparatus to perform, for each IC of the plurality of ICs, a large-scale neighborhood iterative improvement-based (LNII) algorithm.

19. The apparatus of claim 17, wherein when executed, the programming instructions cause the apparatus to perform an algorithm that uses each of the representative input vectors from the set as a starting point, and that then iteratively toggles values of each of the representative input vectors until the particular input vector is identified.

20. The apparatus of claim 17, wherein when executed, the programming instructions cause the apparatus to clusters input vectors from the set that are similar to each other according to a Hamming distance.

21. The apparatus of claim 17, wherein when executed, the programming instructions cause the apparatus to perform a gate-level characterization of the plurality of ICs to determine an effect of manufacturing variability on the circuit design.

22. An apparatus, comprising:

a test device configured to determine, for each respective instance of a same circuit design, at least one starting input vector that reduces leakage current in the respective one of the circuit instances;

wherein the test device is further configured to select, from the determined at least one starting input vector of each respective one of the circuit instances, a set of representative input vectors; and wherein the test device is further configured to use each of the representative input vectors in the set to determine a particular input vector to apply to input terminals of an integrated circuit (IC) having the circuit design so as to minimize leakage current in the IC.

23. The apparatus of claim 22, wherein to determine the at least one starting input vector for each respective one of the circuit instances, the test device is configured to apply, for each of the circuit instances, a large-scale neighborhood iterative improvement-based (LNII) algorithm.

24. The apparatus of claim 22, wherein to use each of the representative input vectors in the set R to determine the particular input vector, the test device is configured to apply an algorithm that uses each of the representative input vectors from the set as a starting point, and that then iteratively toggles values of each of the representative input vectors until the particular input vector is identified.

25. The apparatus of claim 22, wherein to select the set of representative input vectors, the test device is configured to cluster input vectors from the set that are similar to each other according to a Hamming distance.

26. The apparatus of claim 22, wherein the test device is further configured to perform a gate-level characterization to determine an effect of the manufacturing variability on the circuit design.

27. A method for identifying at least one input to meet an operational condition for an integrated circuit (IC), the method comprising:

performing or causing to be performed, by a device, a gate-level characterization of the IC to determine at least one operational property of the IC;

determining, by the device, from the gate-level characterization performed to determine the at least one operational property of the IC, at least one input vector that reduces leakage current in the IC; and applying the determined at least one input vector to the IC.

28. The method of claim 27, wherein said IC includes a sequential circuit or a combinatorial circuit, and wherein said applying the determined at least one input includes applying the identified at least one input vector to an input terminal of the sequential circuit or the combinatorial circuit.

29. The method of claim 27, wherein said determining the at least one input associated with the operational condition includes identifying, by the device, at least one input associated with switching power of the IC and that provides a supply voltage sufficient to operate the IC at reduced power.

* * * * *

UNITED STATES PATENT AND TRADEMARK OFFICE
CERTIFICATE OF CORRECTION

PATENT NO. : 8,443,034 B2
APPLICATION NO. : 12/479584
DATED : May 14, 2013
INVENTOR(S) : Koushanfar et al.

It is certified that error appears in the above-identified patent and that said Letters Patent is hereby corrected as shown below:

In the Drawings

In Fig. 9, Sheet 8 of 8, for Tag "(901)" in Line 1, delete "BASC" and insert -- BASIC --, therefor.

In Fig. 9, Sheet 8 of 8, delete "uP/ uC / DSP" and insert -- μP/ μC / DSP --, therefor.

In Fig. 9, Sheet 8 of 8, for Tag "(915)" in Line 1, delete "CONTROLER" and insert -- CONTROLLER --, therefor.

In the Specification

In Column 2, Line 47, delete "hereof In" and insert -- hereof. In --, therefor.

In Column 3, Line 16, delete "inter alias" and insert -- inter alia, --, therefor.

In Column 3, Lines 22-23, delete "input vector" and insert -- input vectors --, therefor.

In Column 7, Line 5, delete "IC 100," and insert -- IC 102, --, therefor.

In Column 8, Line 31, in Equation "(1)", delete

" $I_{sub} a_0 we^{a1+a2L+a3L^2+a4T_{ox}^{-1} a5T_{ox}}$ " and insert -- $I_{sub} = a_0 we^{a_1 + a_2L + a_3L^2 + a_4T_{ox}^{-1} + a_5T_{ox}}$ --, therefor.

Signed and Sealed this
Twenty-seventh Day of August, 2013

Teresa Stanek Rea
*Acting Director of the United States Patent and Trademark Office*

CERTIFICATE OF CORRECTION (continued)
U.S. Pat. No. 8,443,034 B2

In the Specification

In Column 8, Line 33, in Equation "(2)", delete

" $I_{gate} = a'_0 w e^{a'_1 a'_2 L + a'_3 L^2 + a'_4 T_{ox}^{-1} a'_5 T_{ox}}$ " and insert -- $I_{gate} = a'_0 w e^{a'_1 + a'_2 L + a'_3 L^2 + a'_4 T_{ox}^{-1} + a'_5 T_{ox}}$ --, therefor.

In Column 11, Line 40, delete

" $P(1011) + E_2 = s_X P_{NOR}(10) + s_Y P_{NAND}(11) + s_V P_{NOR}(00) + s_U P_{NAND}(11) + s_V P_{NOR}(10);$ " and insert -- $P(1011) + E_2 = s_X P_{NOR}(10) + s_Y P_{NAND}(11) + s_Z P_{NOR}(00) + s_U P_{NAND}(11) + s_V P_{NOR}(10);$ --, therefor.

In Column 13, Lines 26-27, delete "minimizes o" and insert -- minimizes or --, therefor.

In Column 15, Line 40, in Equation "(5)" delete "{0 otherwise" and insert -- {0, otherwise --, therefor.

In Column 17, Line 4, delete "920" and insert -- 920. --, therefor.

In the Claims

In Column 22, Lines 16-17, in Claim 1, delete "particular integrated circuits" and insert -- a particular integrated circuit --, therefor.